(12) United States Patent
Lee et al.

(10) Patent No.: US 9,508,855 B2
(45) Date of Patent: Nov. 29, 2016

(54) LIQUID CRYSTAL DISPLAY AND MANUFACTURING METHOD THEREOF

(71) Applicant: Samsung Display Co., Ltd., Yongin, Gyeonggi-Do (KR)

(72) Inventors: Hee-Keun Lee, Suwon-si (KR); Seon Uk Lee, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/254,700

(22) Filed: Apr. 16, 2014

(65) Prior Publication Data

US 2015/0162377 A1   Jun. 11, 2015

(30) Foreign Application Priority Data

Dec. 9, 2013   (KR) .......................... 10-2013-0152666

(51) Int. Cl.
*H01L 29/786* (2006.01)
*G02F 1/1333* (2006.01)

(52) U.S. Cl.
CPC ....... *H01L 29/786* (2013.01); *G02F 1/133377* (2013.01); *G02F 2001/133368* (2013.01)

(58) Field of Classification Search
CPC ........... H01L 29/7869; H01L 27/1225; H01L 29/66969; H01L 27/124; H01L 21/02565
See application file for complete search history.

(56) References Cited

U.S. PATENT DOCUMENTS

| 6,198,217 | B1 | 3/2001 | Suzuki et al. |
| 6,469,761 | B1 | 10/2002 | Drabik et al. |
| 6,822,777 | B2 * | 11/2004 | Takenaka ...................... 359/245 |
| 2010/0014011 | A1 | 1/2010 | Mottram et al. |
| 2011/0059560 | A1 * | 3/2011 | Chen .................. H01L 51/5265 438/29 |
| 2011/0260169 | A1 * | 10/2011 | Umezaki et al. ............... 257/59 |

FOREIGN PATENT DOCUMENTS

| JP | 2008033117 A | 2/2008 |
| JP | 2008242031 A | 10/2008 |
| KR | 100688958 B1 | 2/2007 |
| KR | 1020080049193 A | 4/2008 |
| KR | 1020120026880 A | 3/2012 |

* cited by examiner

*Primary Examiner* — Tony Tran
(74) *Attorney, Agent, or Firm* — Innovation Counsel LLP

(57) ABSTRACT

A liquid crystal display includes: a substrate; a thin film transistor disposed on the substrate; a pixel electrode connected to the thin film transistor; and a roof layer facing the pixel electrode. A plurality of microcavities are between the pixel electrode and the roof layer. A liquid crystal material is in the microcavities, and a dent is formed in the roof layer.

5 Claims, 19 Drawing Sheets

LIQUID CRYSTAL DISPLAY AND MANUFACTURING METHOD THEREOF

CROSS-REFERENCE TO RELATED APPLICATION

This application claims priority to and the benefit of Korean Patent Application No. 10-2013-0152666 filed in the Korean Intellectual Property Office on Dec. 9, 2013, the entire contents of which are incorporated herein by reference.

BACKGROUND (a) Field

The present application relates to a liquid crystal display and a manufacturing method thereof.

(b) Description of the Related Art

A liquid crystal display as one of flat panel display devices that are being widely used includes two display panels, wherein field generating electrodes such as a pixel electrode and a common electrode are formed with a liquid crystal layer interposed therebetween.

The liquid crystal display generates an electric field in a liquid crystal layer by applying a voltage to the field generating electrodes to determine orientations of liquid crystal molecules of the liquid crystal layer and control polarization of incident light, thereby displaying an image.

A technique of forming a plurality of microcavities in a pixel and filling the same with liquid crystals to implement a display has been developed for one of the liquid crystal displays. Although two sheets of substrates are used in a conventional liquid crystal display, this technique forms constituent elements on one substrate, thereby reducing weight, thickness, and the like of the device.

A display device for forming a plurality of microcavities forms a roof layer for maintaining the microcavities. The roof layer is consecutively connected between the neighboring microcavities. When a bending force with a curvature radius is applied to the display device, a substantial amount of stress is applied to the roof layer and a crack may occur.

The above information disclosed in this Background section is only for enhancement of understanding of the background and therefore it may contain information that does not form the prior art that is already known in this country to a person of ordinary skill in the art.

SUMMARY

Embodiments have been made in an effort to provide a liquid crystal display for preventing a problem such as cracks when a substrate is bent, and a manufacturing method thereof.

An exemplary embodiment provides a liquid crystal display including: a substrate; a thin film transistor disposed on the substrate; a pixel electrode connected to the thin film transistor; and a roof layer facing the pixel electrode. A plurality of microcavities are between the pixel electrode and the roof layer. The microcavities form a liquid crystal layer. A liquid crystal material is in the microcavities, and the roof layer includes a dent.

The roof layer fills an opening between the microcavities to form a partition wall forming part.

The dent is disposed to overlap the partition wall forming part.

The partition wall forming part is along a data line of the thin film transistor.

The liquid crystal display further includes a lower insulating layer disposed at a lower part of the roof layer and an upper insulating layer disposed at an upper part of the roof layer. The upper insulating layer covers the dent of the roof layer.

The dent forms an open region that passes through the roof layer and extends to the lower insulating layer. The lower insulating layer contacts the upper insulating layer in the open region.

When at least two microcavities neighboring each other from among the plurality of microcavities are set to be a first group, a pattern in which the dent is formed between the first group is repeated.

The liquid crystal display further includes a common electrode and a lower insulating layer disposed between the microcavity and the roof layer, wherein the lower insulating layer is disposed on the common electrode.

The liquid crystal display further includes an upper insulating layer disposed on the roof layer and a capping layer disposed on the upper insulating layer. A liquid crystal injection hole forming region is formed between the microcavities. The capping layer is disposed in the liquid crystal injection hole forming region.

The substrate is a flexible substrate.

Another embodiment provides a method for manufacturing a liquid crystal display as follows. A thin film transistor is formed on a substrate. A pixel electrode is connected to a terminal of the thin film transistor. A sacrificial layer is formed on the pixel electrode. A roof layer is formed on the sacrificial layer. A plurality of microcavities are formed in which liquid crystal injection holes are formed by removing the sacrificial layer. A liquid crystal material is injected into the microcavities. A capping layer is formed on the roof layer and the liquid crystal injection holes, wherein a dent is formed in the roof layer.

The forming of a sacrificial layer includes forming an opening at a part that overlaps a data line of the thin film transistor, and in the forming of a roof layer, the roof layer fills the opening to form a partition wall forming part.

A liquid crystal injection hole forming region is formed between the microcavities, and the dent is formed in the liquid crystal injection hole forming region.

The dent is formed to overlap the partition wall forming part.

The partition wall forming part is formed in parallel with the data line of the thin film transistor.

When at least two microcavities neighboring each other from among the microcavities are set to be a first group, a pattern in which the dent is formed between neighboring first groups is repeated.

The method further includes: forming a lower insulating layer on the sacrificial layer; and forming an upper insulating layer on the roof layer, wherein the upper insulating layer is formed to cover the dent of the roof layer.

The dent passes through the roof layer to form an open region extending to the lower insulating layer, and the lower insulating layer is formed to contact the upper insulating layer in the open region.

According to the exemplary embodiments, the dent is formed in the roof layer so the display device in which the microcavity is formed may receive less stress from external bending deformation.

DETAILED DESCRIPTION OF THE EMBODIMENTS

Figure 1:
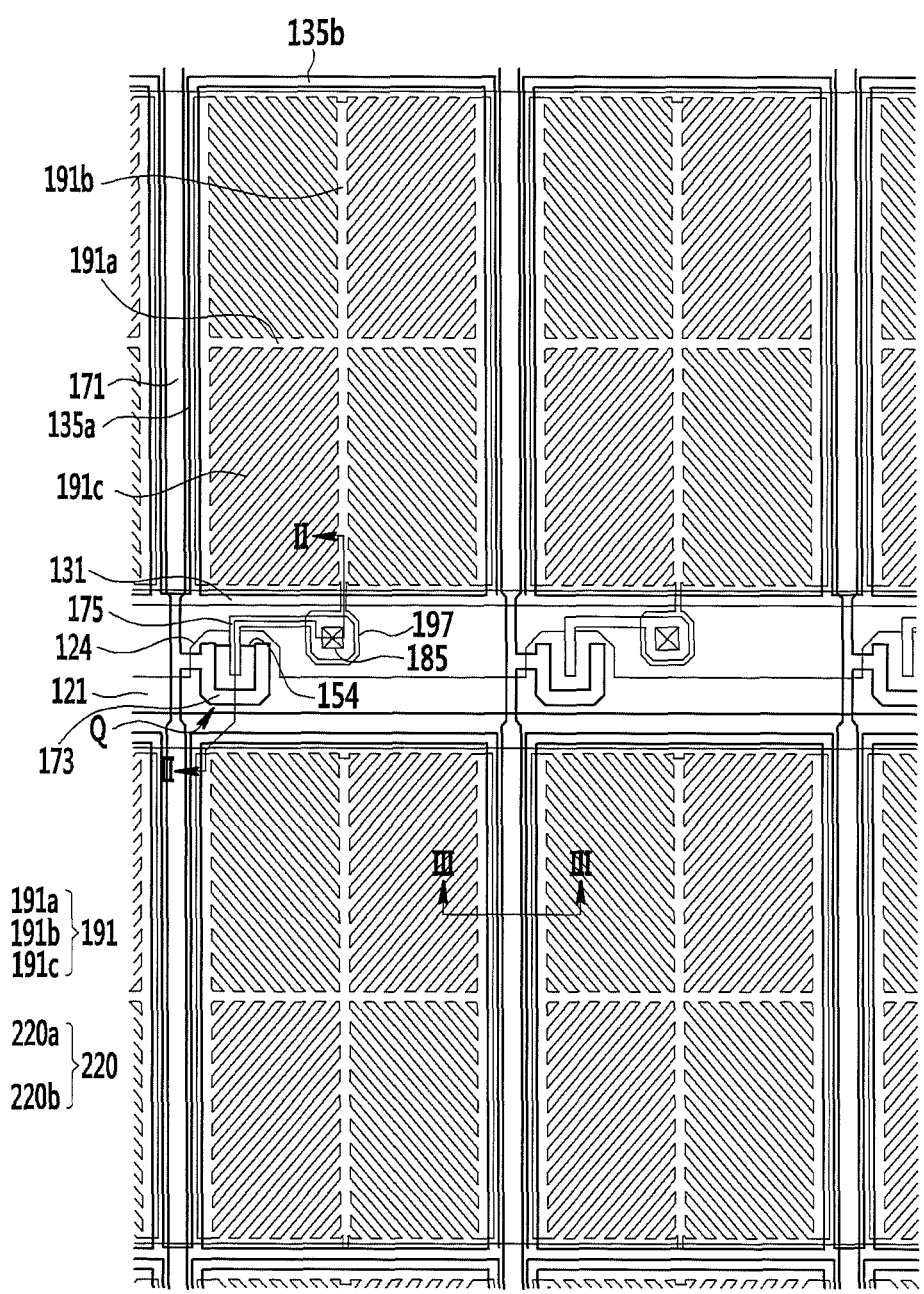
FIG. 1 shows a layout view of a liquid crystal display according to an exemplary embodiment.

Hereinafter, exemplary embodiments will be described in detail with reference to the accompanying drawings. As those skilled in the art would realize, the described embodiments may be modified in various different ways, all without departing from the spirit or scope of the inventive concept. On the contrary, exemplary embodiments introduced herein are disposed to make disclosed contents thorough and complete and sufficiently transfer the spirit of the inventive concept to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening them may also be present. Like reference numerals designate like elements throughout the specification.

Figure 2:
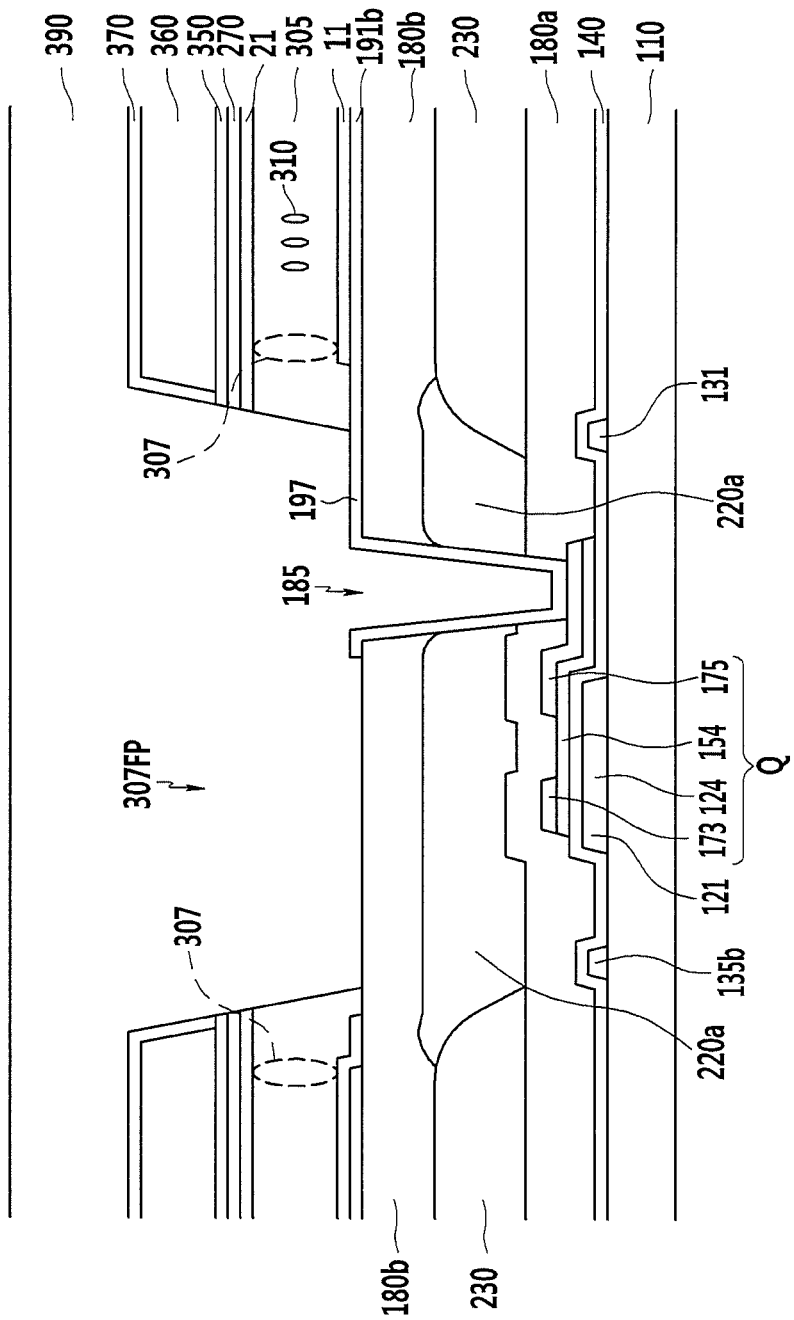
FIG. 2 shows a cross-sectional view with respect to a line of II-II of FIG. 1.
Figure 3:
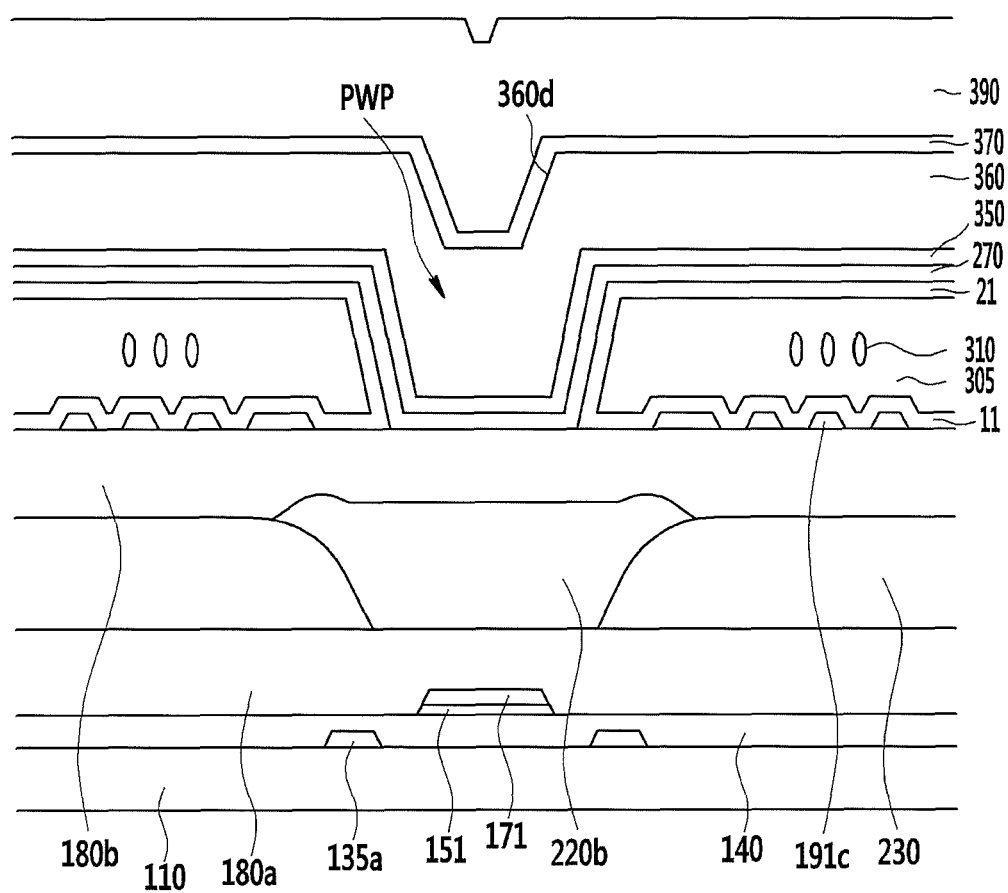
FIG. 3 shows a cross-sectional view with respect to a line of of FIG. 1.

FIG. 1 shows a layout view of a liquid crystal display according to an exemplary embodiment. FIG. 2 shows a cross-sectional view with respect to a line of II-II of FIG. 1. FIG. 3 shows a cross-sectional view with respect to a line of III-III of FIG. 1.

FIG. 1 shows a 2*2 pixel part from among a plurality of pixels, and such pixels may be repeatedly arranged from top to bottom and from right to left in a liquid crystal display according to an exemplary embodiment.

Referring to FIG. 1 to FIG. 3, a gate line 121 and a storage electrode line 131 are formed on a substrate 110 made of transparent glass or plastic. The gate line 121 includes a gate electrode 124. The storage electrode line 131 is generally extended in a horizontal direction and transmits a predetermined voltage such as a common voltage (Vcom). The storage electrode line 131 includes a pair of perpendicular storage electrodes 135a that are extended to be substantially perpendicular to the gate line 121, and a horizontal storage electrode 135b for connecting ends of the pair of perpendicular storage electrodes 135a. The storage electrodes 135a and 135b surround a pixel electrode 191.

A gate insulating layer 140 is formed on the gate line 121 and the storage electrode line 131. A semiconductor layer 151 disposed to a lower part of the data line 171 and a semiconductor layer 154 disposed to a lower part of source/drain electrodes and a channel of a thin film transistor (Q) are formed on the gate insulating layer 140.

A plurality of ohmic contacts may be formed on the semiconductor layers 151 and 154 and between the data line 171 and the source/drain electrodes, which are omitted is the drawing.

Data conductors 171, 173, and 175 including a source electrode 173, a data line 171 connected to the source electrode 173, and a drain electrode 175 are formed on the semiconductor layers 151 and 154 and the gate insulating layer 140.

The gate electrode 124, the source electrode 173, and the drain electrode 175 form a thin film transistor (Q) together with the semiconductor layer 154, and the channel of the thin film transistor (Q) is formed on the semiconductor layer 154 between the source electrode 173 and the drain electrode 175.

A first interlayer insulating layer 180a is formed on the data conductors 171, 173, and 175 and the exposed semiconductor layer 154. The first interlayer insulating layer 180a may include an inorganic insulator such as a silicon nitride (SiNx) or a silicon oxide (SiOx), or an organic insulator.

A color filter 230 and a light blocking member 220 are formed on the first interlayer insulating layer 180a.

The light blocking member 220 is formed have a lattice structure having an opening that corresponds to a region for displaying an image, and it is formed with a material through which light may not transmit. The color filter 230 is formed in the opening of the light blocking member 220. The light blocking member 220 includes a horizontal light blocking member 220a formed in parallel with the gate line 121, and a perpendicular light blocking member 220b formed in parallel with the data line 171.

The color filter 230 displays primary colors including red, green, and blue. However, the colors are not limited to the three primary colors including red, green, and blue, and the color filter 230 may also display one among a cyan-based color, a magenta-based color, a yellow-based color, and a white-based color. The color filter 230 may be formed of materials displaying different colors for each adjacent pixel.

A second interlayer insulating layer 180b is formed on the color filter 230 and the light blocking member 220 to cover the same. The second interlayer insulating layer 180b may include an inorganic insulator such as a silicon nitride (SiNx) or a silicon oxide (SiOx), or an organic insulator. Unlike those illustrated in the cross-sectional view of FIG. 2, when a step is generated due to a thickness difference between the color filter 230 and the light blocking member 220, the second interlayer insulating layer 180b includes the organic insulator to reduce or remove the step.

A contact hole 185 for exposing the drain electrode 175 is formed in the color filter 230, the light blocking member 220, and the interlayer insulating layers 180a and 180b.

A pixel electrode 191 is formed on the second interlayer insulating layer 180b. The pixel electrode 191 may be made of a transparent conductive material such as ITO or IZO.

The pixel electrode 191 has a quadrangular shape and includes cross stems including a horizontal stem 191a and a perpendicular stem 191b crossing the same. Further, the pixel electrode 191 is divided into four sub-regions by the horizontal stem 191a and the perpendicular stem 191b, and each sub-region includes a plurality of micro-branches 191c. In addition, the sub-region may further include an outer stem for surrounding the pixel electrode 191.

The micro-branch 191c of the pixel electrode 191 has an angle of substantially 40 to 45 degrees with respect to the gate line 121 or the horizontal stem. The micro-branches of the two neighboring sub-regions may also cross each other.

Further, a width of the micro-branch may be gradually increased or a gap between the micro-branches 191c may be different.

The pixel electrode 191 is connected to a bottom of the perpendicular stem 191b, includes an extension 197 that is wider than the perpendicular stem 191b, is physically and electrically connected to the drain electrode 175 through the contact hole 185 at the extension 197, and receives a data voltage from the drain electrode 175.

The above descriptions of the thin film transistor (Q) and the pixel electrode 191 are examples, and a configuration of the thin film transistor and a design of the pixel electrode may be changed so as to improve lateral visibility.

A lower alignment layer 11 is formed on the pixel electrode 191, and the lower alignment layer 11 may be a perpendicular alignment layer. The lower alignment layer 11 may be formed by including at least one of materials that are generally used for a liquid crystal alignment layer, such as polyamic acid, polysiloxane, or polyimide. Further, the lower alignment layer 11 may be a photoalignment layer.

An upper alignment layer 21 is disposed on a part that faces the lower alignment layer 11, and a microcavity 305 is formed between the lower alignment layer 11 and the upper alignment layer 21. A liquid crystal material including liquid crystal molecules 310 is injected into the microcavity 305 through a liquid crystal injection hole 307 to form a liquid crystal layer. The microcavity 305 may be formed in a column direction of the pixel electrode 191, that is, the perpendicular direction. The alignment material for forming the alignment layers 11 and 21 and the liquid crystal material including the liquid crystal molecules 310 may be injected into the microcavity 305 by using a capillary force.

The microcavity 305 is divided in the perpendicular direction by a plurality of liquid crystal injection hole forming regions 307FP disposed at a part that overlaps the gate line 121, and a plurality of microcavities 305 are formed in a direction in which the gate line 121 is extended. The microcavities 305 may correspond to one or more pixel areas which may correspond to a region that displays a screen.

A common electrode 270 and a lower insulating layer 350 are disposed on the upper alignment layer 21. The common electrode 270 receives the common voltage and generates an electric field together with the pixel electrode 191 to which the data voltage is applied to determine a direction in which the liquid crystal molecules 310 disposed in the microcavity 305 between the two electrodes are slanted. The common electrode 270 forms a capacitor together with the pixel electrode 191, and maintains the voltage when the thin film transistor is turned off. The lower insulating layer 350 may be formed with a silicon nitride (SiNx) or a silicon oxide (SiOx).

The common electrode 270 has been described to be disposed in the microcavity 305 in the present exemplary embodiment, and it is also possible for the common electrode 270 to be formed at a lower part of the microcavity 305 and be liquid crystal driven according to a coplanar electrode (CE) mode in another exemplary embodiment.

A roof layer 360 is disposed on the lower insulating layer 350. The roof layer 360 performs a support function to maintain the microcavity 305 that is a space between the pixel electrode 191 and the common electrode 270. The roof layer 360 may include a photoresist or another organic material.

According to the exemplary embodiment, a dent 360d is formed in the roof layer 360. The dent 360d is formed at a position overlapping a partition wall forming part (PWP) between neighboring microcavities 305. The dent 360d may have a shape of which a top side of the roof layer 360 is dented, and the dent 360d may have various shapes.

An upper insulating layer 370 is disposed on the roof layer 360. The upper insulating layer 370 may contact a top side of the roof layer 360. The upper insulating layer 370 may cover the dent 360d. The upper insulating layer 370 may be formed with a silicon nitride (SiNx) or a silicon oxide (SiOx).

A capping layer 390 is disposed on the upper insulating layer 370. The capping layer 390 is disposed in a liquid crystal injection hole forming region 307FP, and it covers the liquid crystal injection hole 307 of the microcavity 305 exposed by the liquid crystal injection hole forming region 307FP. The capping layer 390 includes an organic material or an inorganic material. Here, it has been shown that the liquid crystal material is removed from the liquid crystal injection hole forming region 307FP and remains only in the microcavities 305. However, it is also possible for an extra liquid crystal material after being injected into the microcavity 305 still remains in the liquid crystal injection hole forming region 307FP.

As shown in FIG. 3, the partition wall forming part (PWP) is formed between the microcavities 305 neighboring in the horizontal direction. The partition wall forming part (PWP) may be formed in a direction in which the data line 171 is extended, and it may be covered by the roof layer 360. The partition wall forming part (PWP) is filled with the lower insulating layer 350, the common electrode 270, the upper insulating layer 370, and the roof layer 360, and such a structure forms a partition wall and divides or defines the microcavity 305. Since a partition wall structure such as the partition wall forming part (PWP) is disposed between the microcavities 305, less stress may be generated when the substrate 110 is bent, and a bending degree of the cell gap may be substantially reduced.

Figure 4:
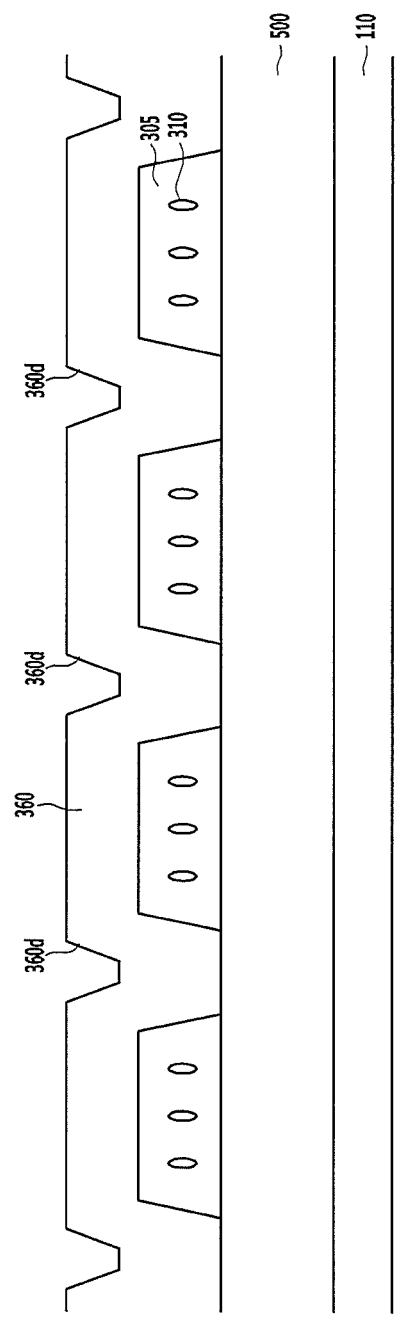
FIG. 4 shows a cross-sectional view of a pattern of a roof layer shown in FIG. 2.
Figure 5:
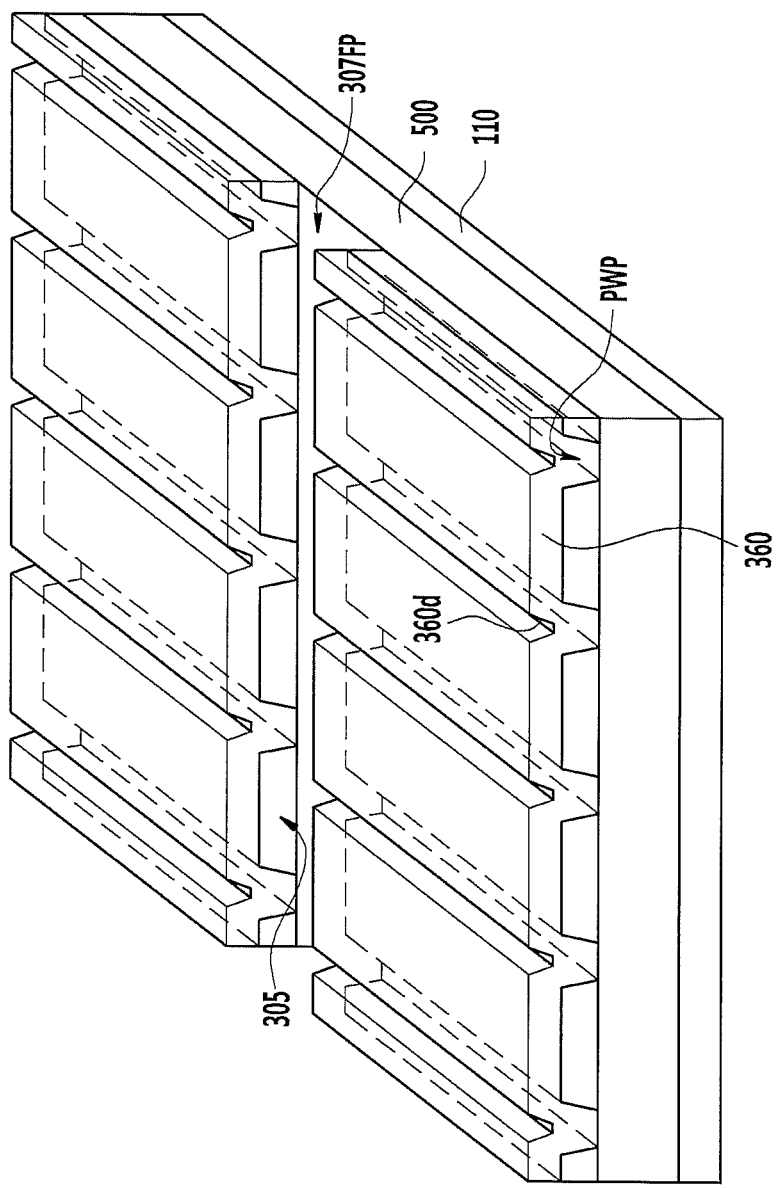
FIG. 5 shows a perspective view of a pattern of a roof layer shown in FIG. 4.

FIG. 4 shows a cross-sectional view of a pattern of a roof layer shown in FIG. 2. FIG. 5 shows a perspective view of a pattern of a roof layer shown in FIG. 4.

Referring to FIG. 4 and FIG. 5, the roof layer 360 is disposed on the microcavities 305 neighboring in the direction in which the gate line 121 is extended, and the dent 360d is formed between the neighboring microcavities 305. The dent 360d may be formed in the direction in which the data line 171 is extended.

Since the dent is formed in the roof layer in the exemplary embodiment, it is easy to change the curvature when the substrate 110 is bent, and the upper insulating layer 370 disposed at an upper part of the roof layer 360 is prevented from being cracked.

In FIG. 4 and FIG. 5, a thin film transistor panel 500 including a thin film transistor, a color filter, a light blocking member, and a pixel electrode is disposed on the substrate 110.

Figure 6:
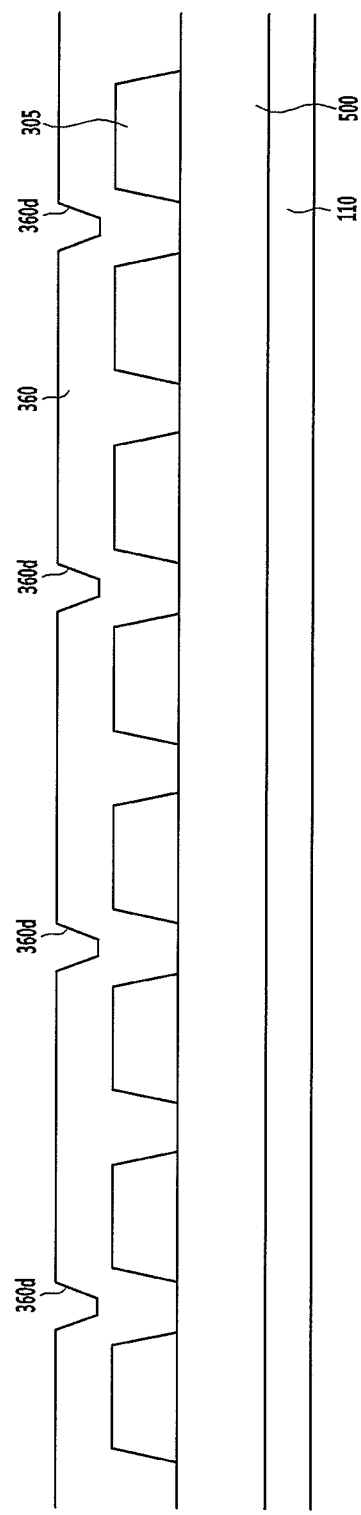
FIG. 6 shows a cross-sectional view of a changed pattern of a roof layer shown in FIG. 4 according to an exemplary embodiment.
Figure 7:
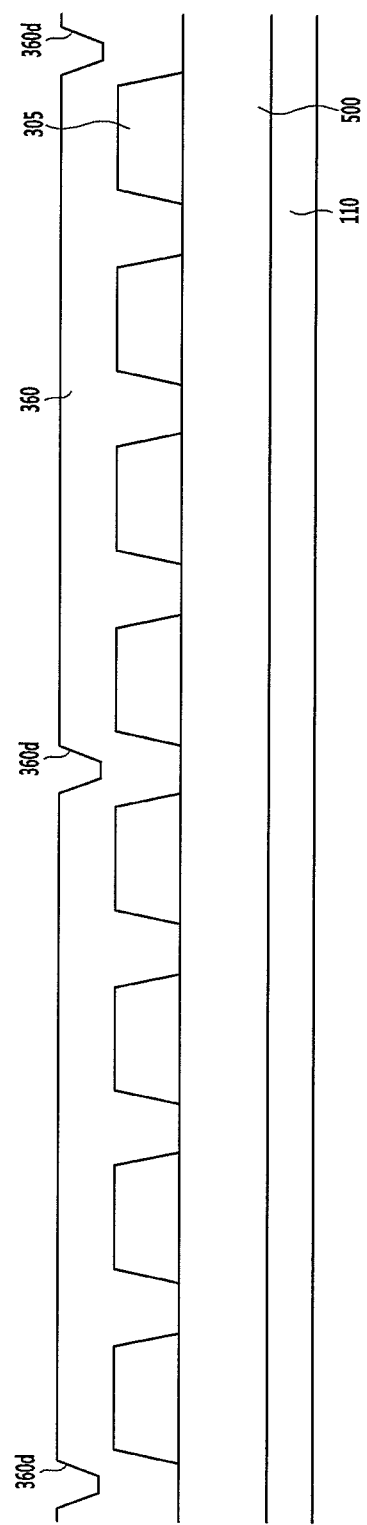
FIG. 7 shows a cross-sectional view of a changed pattern of a roof layer shown in FIG. 6 according to an exemplary embodiment.

FIG. 6 shows a cross-sectional view of a changed pattern of a roof layer shown in FIG. 4 according to an exemplary embodiment. FIG. 7 shows a cross-sectional view of a changed pattern of a roof layer shown in FIG. 6 according to an exemplary embodiment.

In FIG. 6 and FIG. 7, when at least two microcavities 305 neighboring each other from among a plurality of microcavities 305 are set to be a first group, a plurality of first groups may be formed and the dent 360d may be formed between the first groups. FIG. 6 shows that the first group includes two microcavities 305, and FIG. 7 shows that the first group includes four microcavities 305 according to the exemplary embodiment.

In FIG. 6 and FIG. 7, a thin film transistor panel 500 including a thin film transistor, a color filter, a light blocking member, and a pixel electrode is disposed on the substrate 110.

Figure 8:
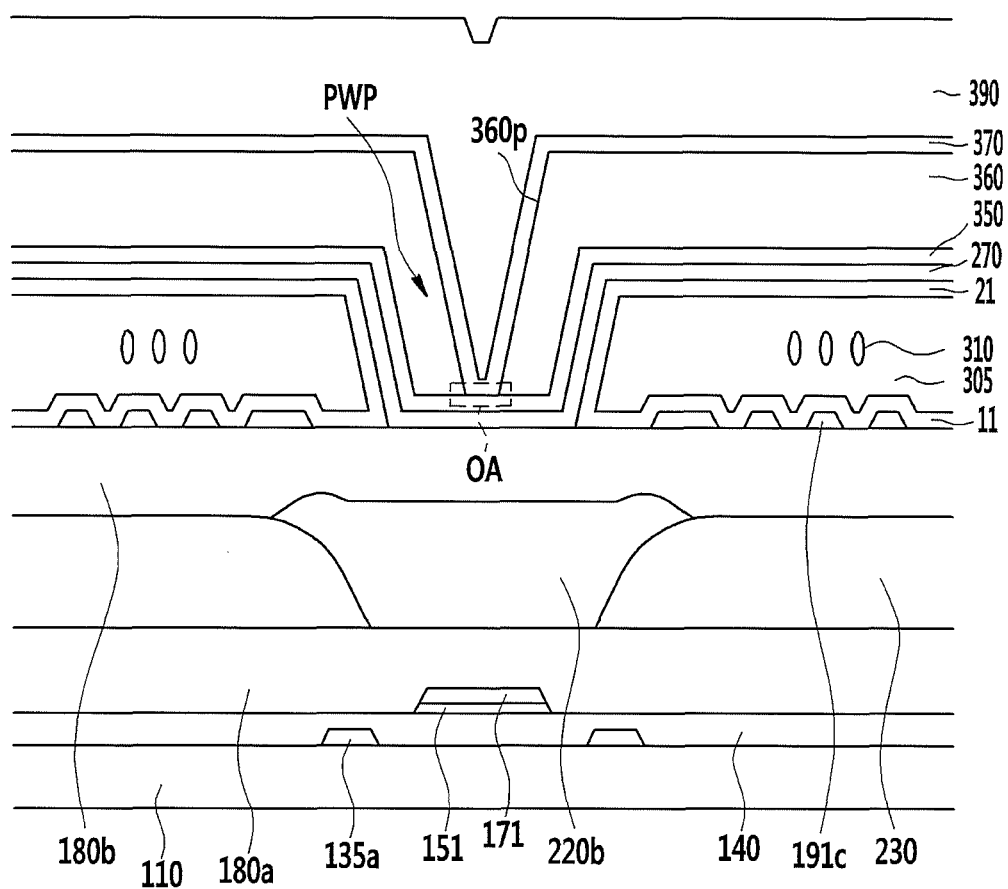
FIG. 8 shows a cross-sectional view of a changed pattern of a roof layer shown in FIG. 3 according to an exemplary embodiment.

FIG. 8 shows a cross-sectional view of a changed pattern of a roof layer shown in FIG. 3 according to an exemplary embodiment.

The dent 360d is passed through the roof layer 360 to form a roof layer penetrator 360p extending to and exposing an open region (OA). In this instance, the open region (OA) for exposing the lower insulating layer 350 may be formed, and the lower insulating layer 350 may contact the upper insulating layer 370 in the open region (OA). The contents described with reference to FIG. 3 except the above-noted difference are applicable to the present exemplary embodiment.

A method for manufacturing a liquid crystal display according to an exemplary embodiment will now be described with reference to FIG. 9 to FIG. 19. The manufacturing method according to an exemplary embodiment to be described hereinafter is variable to other forms.

FIG. 9 to FIG. 19 show cross-sectional views of a method for manufacturing a liquid crystal display according to an exemplary embodiment. FIGS. 9, 11, 13, 15, 16, and 18 sequentially show cross-sectional views with respect to a line II-II of FIG. 1. FIGS. 10, 12, 14, 17, and 19 show cross-sectional views with respect to a line III-III of FIG. 1.

Figure 9:
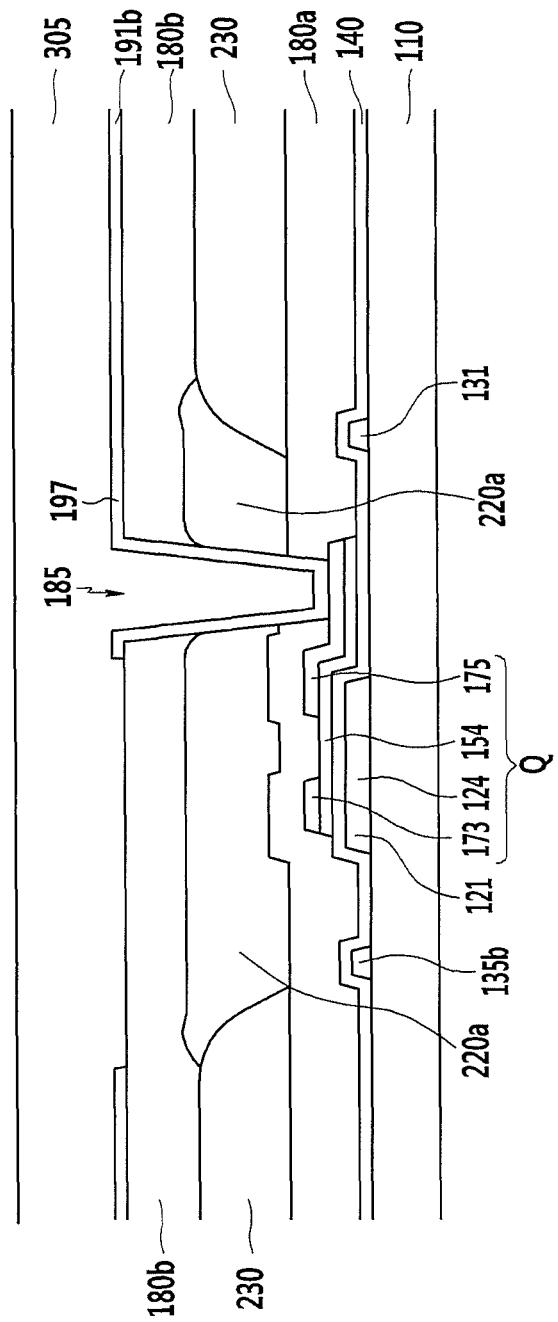
FIGS. 9, 10, 11, 12, 13, 14, 15, 16, 17, 18, 19 show cross-sectional views of a method for manufacturing a liquid crystal display according to an exemplary embodiment.
Figure 10:
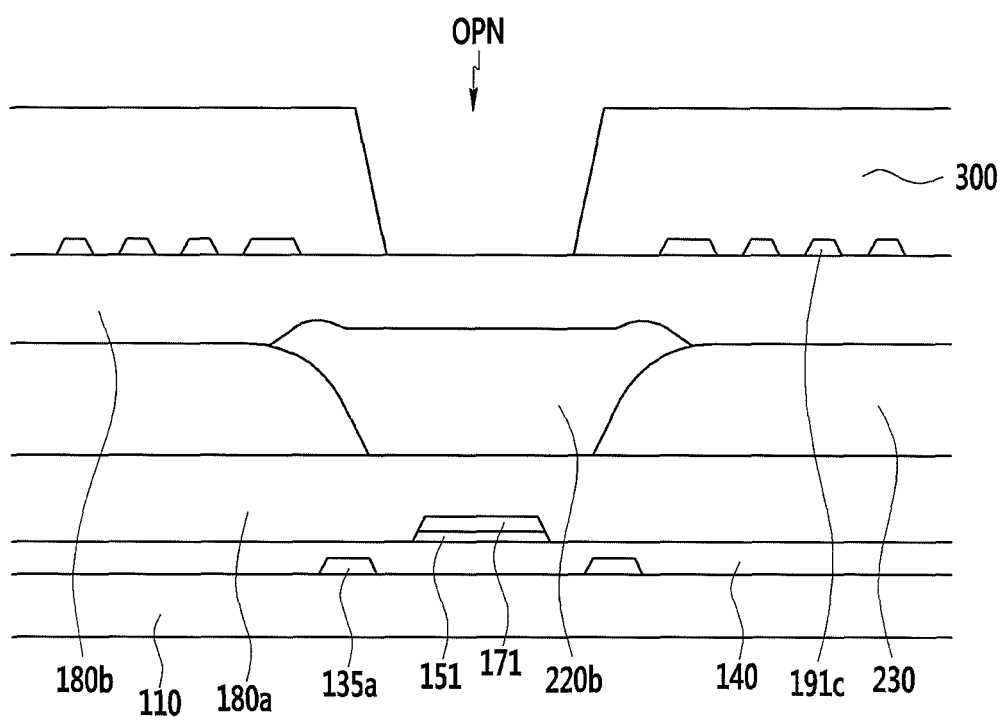

Referring to FIG. 1, FIG. 9, and FIG. 10, in order to form a switch on the substrate 110, a gate line 121 extended in the horizontal direction is formed, a gate insulating layer 140 is formed on the gate line 121, semiconductor layers 151 and 154 are formed on the gate insulating layer 140, and a source electrode 173 and a drain electrode 175 are formed. In this instance, the data line 171 connected to the source electrode 173 may be formed to cross the gate line 121 and be extended in the perpendicular direction.

Data conductors 171, 173, and 175 including a source electrode 173, a drain electrode 175, and a data line 171 are formed, and a first interlayer insulating layer 180a is formed on the exposed semiconductor layer 154.

A color filter 230 is formed at a position that corresponds to the pixel area on the first interlayer insulating layer 180a, and a light blocking member 220 is formed between the color filter 230. The light blocking member 220 includes a horizontal light blocking member 220a formed in parallel with the gate line 121 and a perpendicular light blocking member 220b formed in parallel with the data line 171.

A second interlayer insulating layer 180b is formed on the color filter 230 and the light blocking member 220 to cover the same, and it is formed to have a contact hole 185 for electrically and physically connecting the pixel electrode 191 and the drain electrode 175.

A pixel electrode 191 is formed on the second interlayer insulating layer 180b, and a sacrificial layer 300 is formed on the pixel electrode 191. As shown in FIG. 10, an opening (OPN) is formed in parallel with the data line 171 on the sacrificial layer 300. A common electrode 270, a lower insulating layer 350, a roof layer 360, and an upper insulating layer 370 may be filled in the opening (OPN) to form a partition wall forming part (PWP) in a subsequent process.

Figure 11:
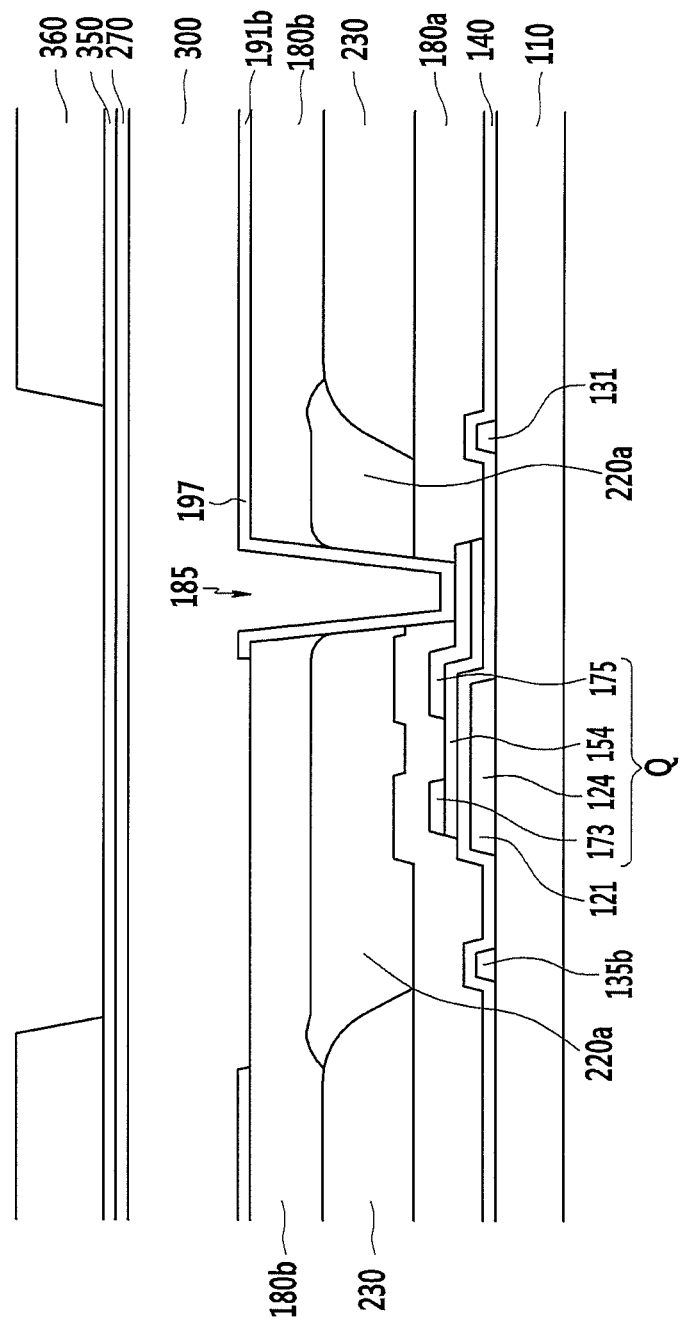
Figure 12:
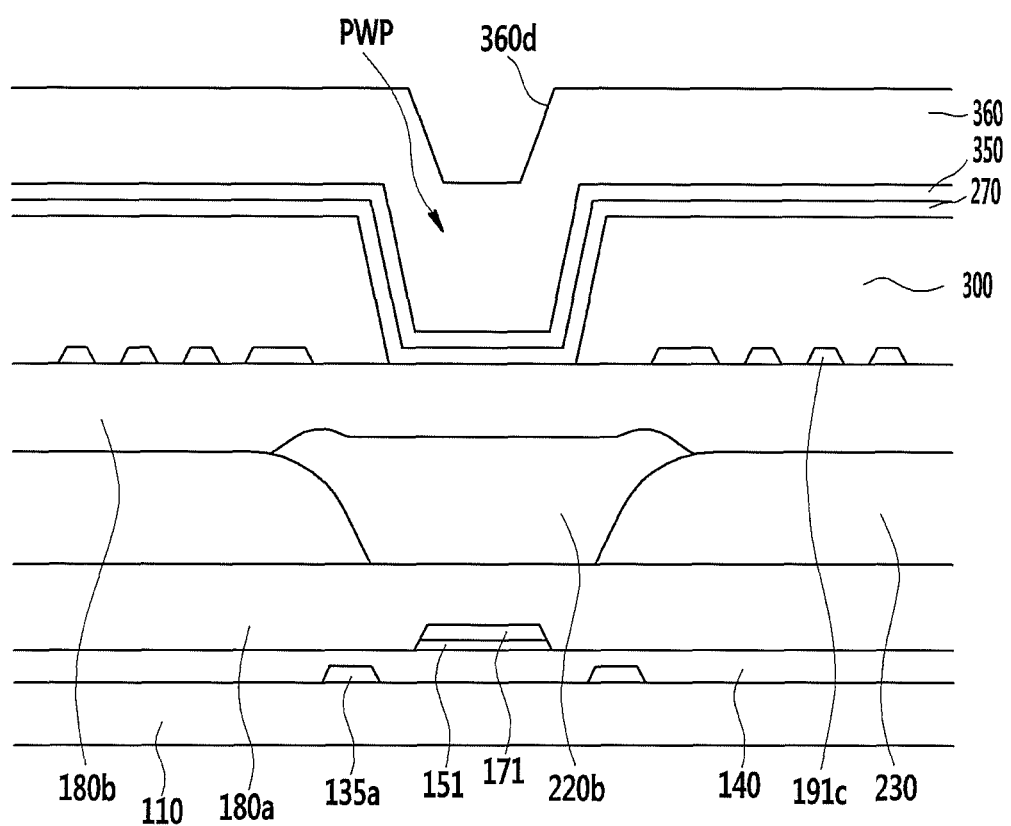

Referring to FIG. 1, FIG. 11, and FIG. 12, the common electrode 270, the lower insulating layer 350, and the roof layer 360 are sequentially formed on the sacrificial layer 300. The roof layer 360 may be removed from the region that corresponds to the horizontal light blocking member 220a disposed between the pixel area neighboring in the perpendicular direction by an exposure and development process. In this instance, a mask may be used, and a dent 360d may be formed at an upper part of the roof layer 360 disposed between the microcavity 305 neighboring in the horizontal direction by using the mask. In a modified exemplary embodiment, the dent 360d may be formed at an upper part of the roof layer 360 without using the mask by increasing a gap of the sacrificial layer 300 neighboring in the horizontal direction. The gap between the sacrificial layer 300 for forming the dent 360d without using the mask is not specified because it is variable by a process condition, such as a thickness of the roof layer 360.

The roof layer 360 exposes the lower insulating layer 350 to the outside in the region that corresponds to the horizontal light blocking member 220a. In other words, an opening in the roof layer extends to and exposes the lower insulating layer 350 to the outside in the region that corresponds to the horizontal light blocking member 220a. In this instance, the common electrode 270, the lower insulating layer 350, and the roof layer 360 fill the opening (OPN) (see FIG. 10) of the perpendicular light blocking member 220b and form the partition wall forming part (PWP).

Figure 13:
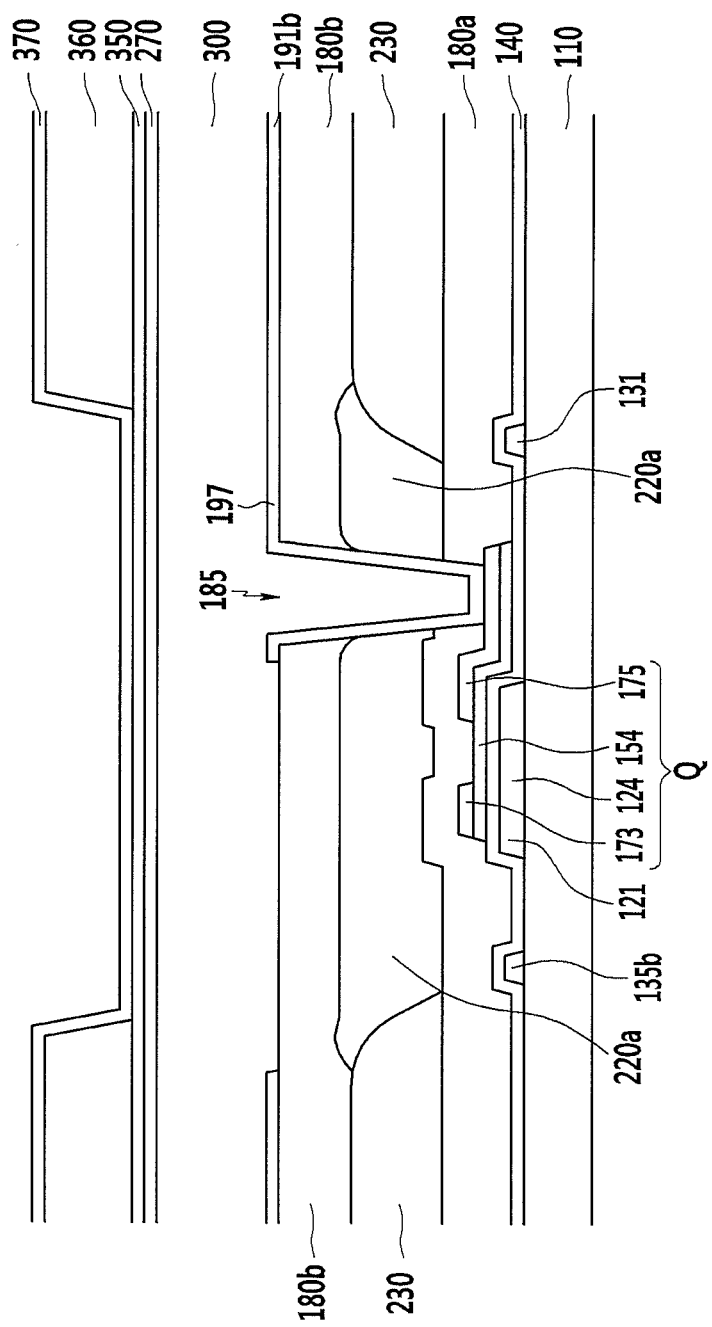
Figure 14:
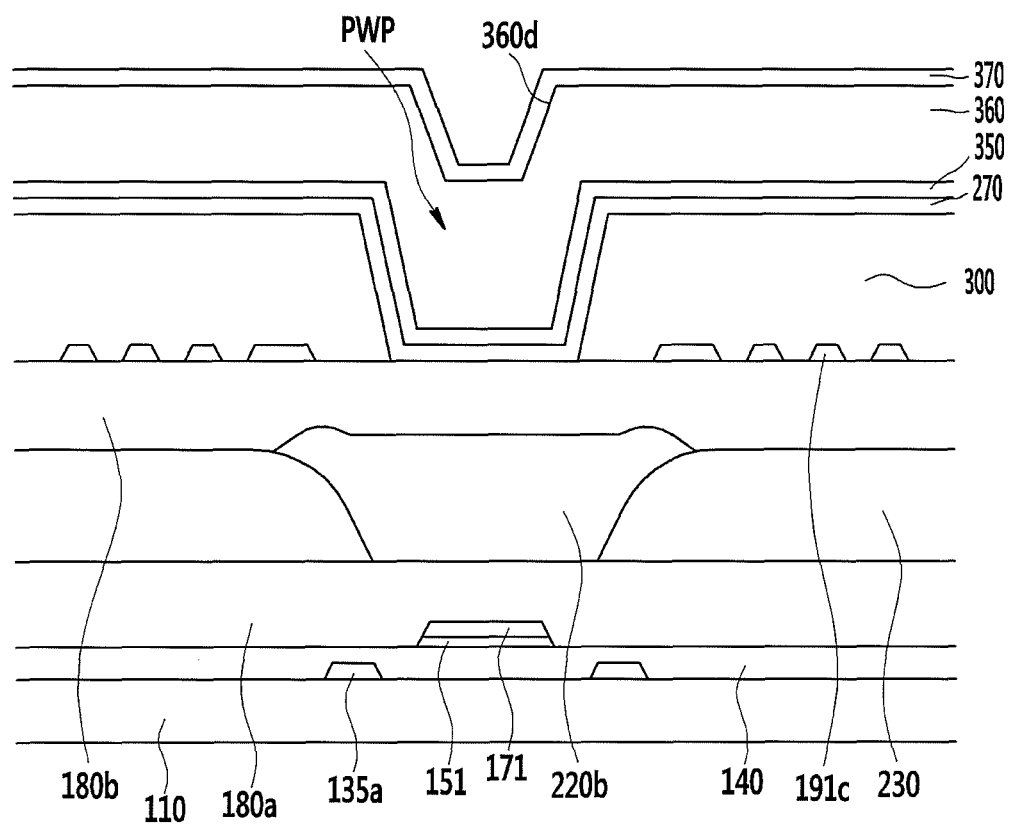

Referring to FIG. 1, FIG. 13, and FIG. 14, an upper insulating layer 370 is formed to cover the roof layer 360 and the exposed lower insulating layer 350. The upper insulating layer 370 may be formed while covering the dent 360d of the roof layer 360.

Figure 15:
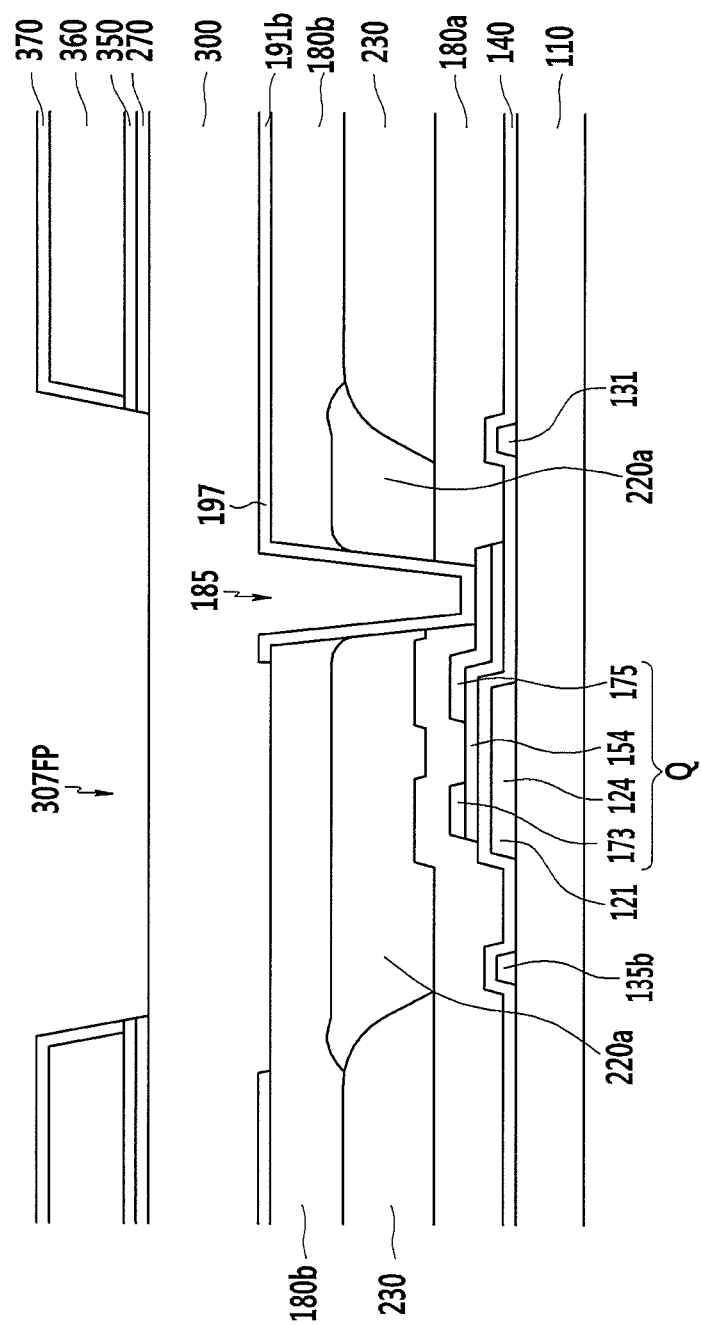

Referring to FIG. 15, when the upper insulating layer 370, the lower insulating layer 350, and the common electrode 270 are dry etched, the upper insulating layer 370, the lower insulating layer 350, and the common electrode 270 are partially removed to form the liquid crystal injection hole forming region 307FP. In this instance, the upper insulating layer 370 may cover the side of the roof layer 360, and without being restricted to this, the side of the roof layer 360 may be exposed by removing the upper insulating layer 370 covering the side of the roof layer 360.

Figure 16:
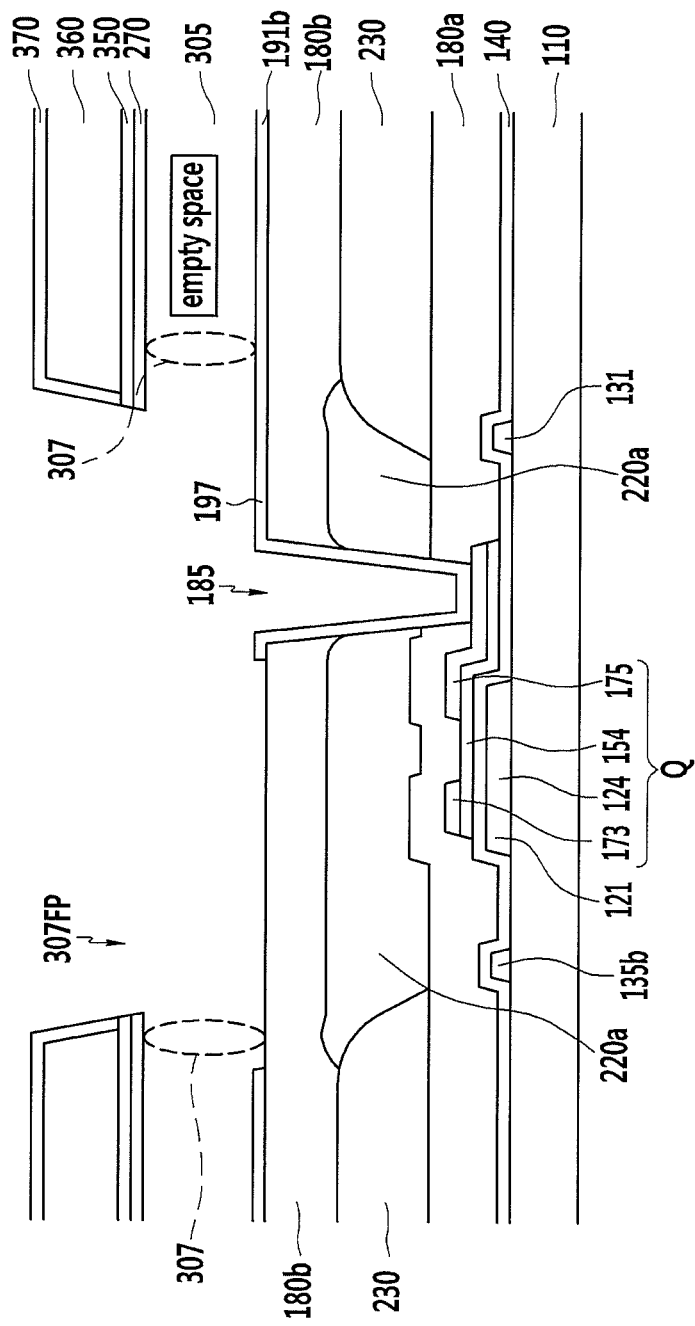
Figure 17:
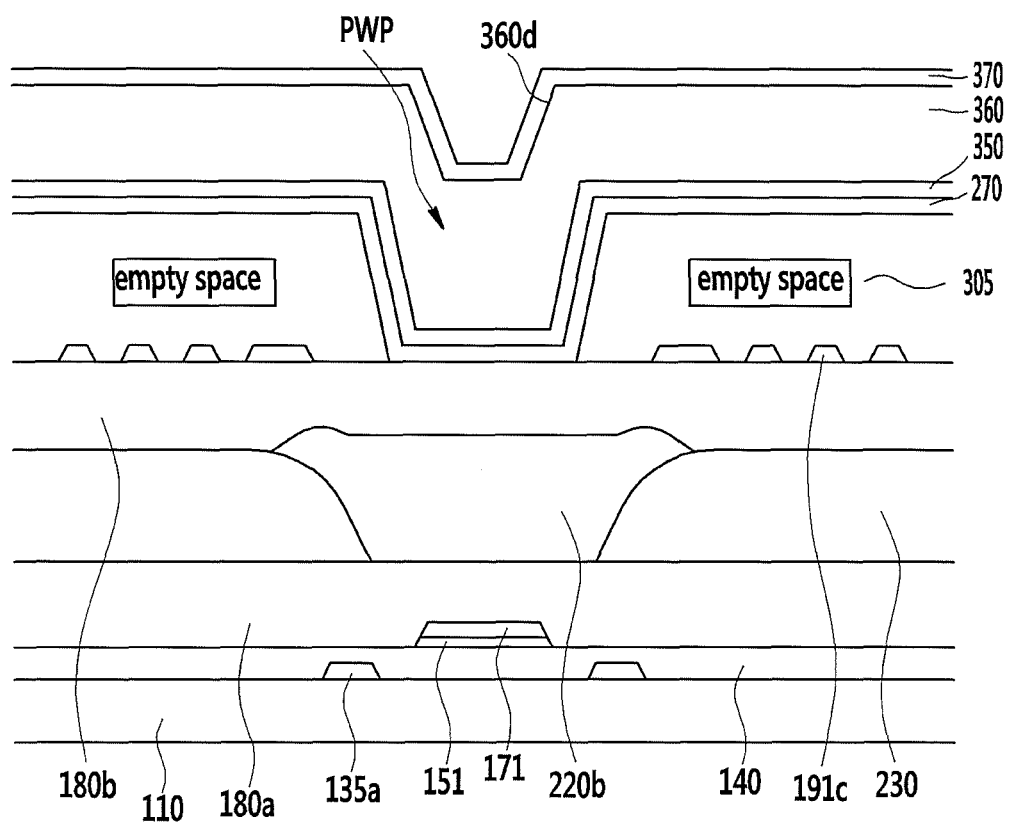

Referring to FIG. 16 and FIG. 17, the sacrificial layer 300 is removed through the liquid crystal injection hole forming region 307FP by performing an oxygen ($O_2$) ashing process or a wet etching process. In this instance, a microcavity 305 including a liquid crystal injection hole 307 is formed. The microcavity 305 is an empty space from which the sacrificial layer 300 is removed.

Figure 18:
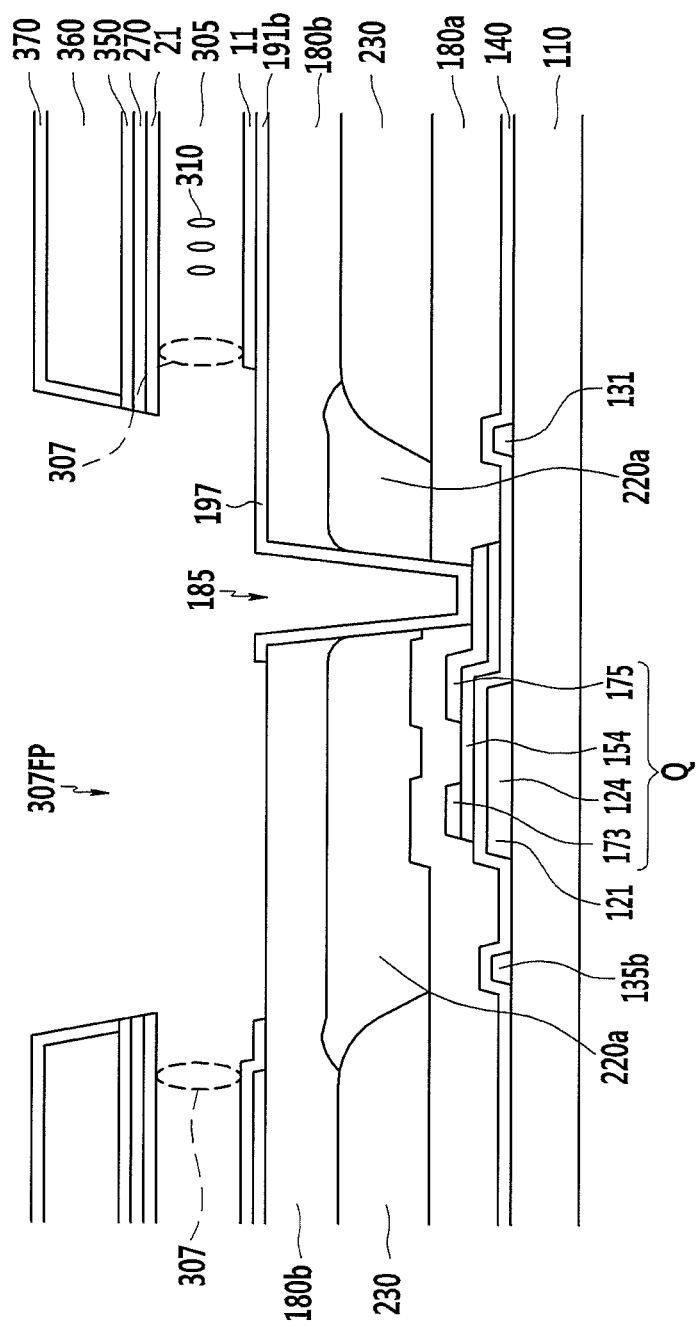
Figure 19:
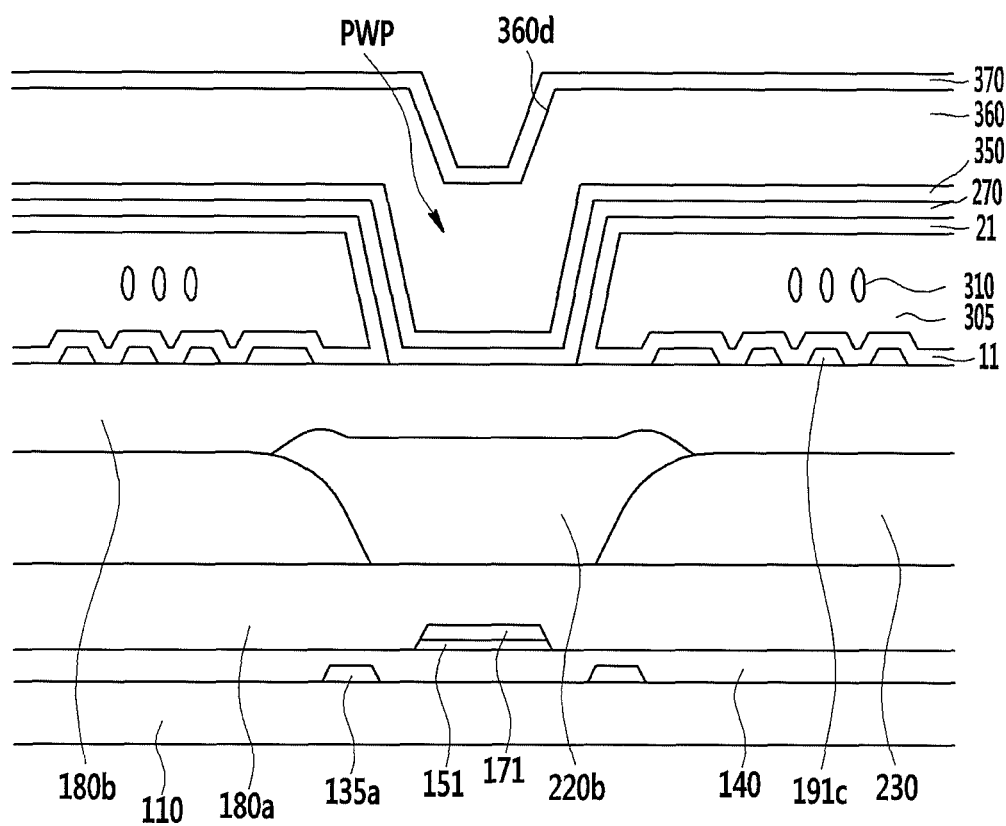

Referring to FIG. 18 and FIG. 19, an alignment material is injected through the liquid crystal injection hole 307 to form alignment layers 11 and 21 on the pixel electrode 191 and the common electrode 270. In detail, an alignment material including a solid and a solvent is injected through the liquid crystal injection hole 307, and a bake process is then performed.

A liquid crystal material including liquid crystal molecules 310 is injected into the microcavity 305 through the liquid crystal injection hole 307 by using an inkjet method.

When a capping layer 390 is formed to cover the liquid crystal injection hole 307 and the liquid crystal injection hole forming region 307FP on the upper insulating layer 370, the liquid crystal display as shown in FIG. 2 may be formed.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A liquid crystal display comprising:
a substrate;
a thin film transistor disposed on the substrate;
a pixel electrode connected to the thin film transistor;
a roof layer facing the pixel electrode;
a liquid crystal layer disposed in a plurality of microcavities between the pixel electrode and the roof layer;
wherein the roof layer comprises a lower surface facing the pixel electrode and an upper surface corresponding to the lower surface,
the lower surface of the roof layer has a protrusion towards the substrate between the plurality of microcavities and the upper surface of the roof layer has a dent, and
the dent in the roof layer which is disposed on the neighboring microcavities, wherein the dent is disposed between the neighboring microcavities; and
a capping layer disposed on the roof layer and has some region within the dent, wherein a liquid crystal injection hole forming region is between the microcavities, and the capping layer is disposed in the liquid crystal injection hole forming region;
wherein the dent is disposed to overlap the protrusion of the roof layer;
wherein the protrusion of the roof layer is along a data line of the thin film transistor;
further including a lower insulating layer disposed at a lower part of the roof layer, and
an upper insulating layer disposed at an upper part of the roof layer,
wherein the upper insulating layer covers the dent of the roof layer; and
wherein the dent forms an open region that passes through the roof layer,
wherein the open region exposes the lower insulating layer, and
wherein the lower insulating layer contacts the upper insulating layer in the open region.

2. The liquid crystal display of claim 1, wherein
when at least two microcavities neighboring each other from among the plurality of microcavities are set to be a first group, a pattern in which the dent is formed between the first group is repeated.

3. The liquid crystal display of claim 1, further including
a common electrode and the lower insulating layer disposed between the microcavity and the roof layer, wherein
the lower insulating layer is disposed on the common electrode.

4. The liquid crystal display of claim 3, further including:
the upper insulating layer disposed on the roof layer; and
the capping layer is disposed on the upper insulating layer.

5. The liquid crystal display of claim 1, wherein the substrate is a flexible substrate.

* * * * *